(12) United States Patent
Heyoung

(10) Patent No.: US 9,000,397 B1
(45) Date of Patent: Apr. 7, 2015

(54) SPECIMEN HOLDER FOR OBSERVING TOP SECTION OF SPECIMEN AND METHOD FOR CONTROLLING THE SAME

(71) Applicant: Hitachi High-Technologies Korea Co., Ltd., Seoul (KR)

(72) Inventor: Heyoung Cheol Heyoung, Gyeonggi-do (KR)

(73) Assignee: Hitachi High-Technologies Korea Co., Ltd. (KR)

( * ) Notice: Subject to any disclaimer, the term of this patent is extended or adjusted under 35 U.S.C. 154(b) by 0 days.

(21) Appl. No.: 14/059,014

(22) Filed: Oct. 21, 2013

(30) Foreign Application Priority Data

Sep. 13, 2013 (KR) .......................... 10-2013-0110662

(51) Int. Cl.
*H01J 37/20* (2006.01)
*H01J 37/28* (2006.01)

(52) U.S. Cl.
CPC ............... *H01J 37/20* (2013.01); *H01J 37/28* (2013.01); *H01J 2237/2802* (2013.01)

(58) Field of Classification Search
CPC ............................... H01J 37/20; H01J 37/27
USPC .......... 250/440.11, 442.11, 307, 310; 73/863, 73/864.91
See application file for complete search history.

(56) References Cited

U.S. PATENT DOCUMENTS

| | | | |
|---|---|---|---|
| 5,089,708 A * | 2/1992 | Asselbergs | 250/442.11 |
| 5,225,683 A * | 7/1993 | Suzuki et al. | 250/442.11 |
| 5,332,275 A * | 7/1994 | Conway et al. | 294/100 |
| 6,027,522 A * | 2/2000 | Palmer | 606/205 |
| 6,410,925 B1 * | 6/2002 | Armbruster et al. | 250/442.11 |
| 6,779,410 B2 * | 8/2004 | Koo et al. | 73/863 |
| 8,513,621 B2 * | 8/2013 | Nackashi et al. | 250/440.11 |
| 2002/0194938 A1 * | 12/2002 | Koo et al. | 73/864.91 |
| 2003/0047689 A1 * | 3/2003 | Kasai | 250/442.11 |
| 2004/0237670 A1 * | 12/2004 | Koo et al. | 73/863 |
| 2005/0035302 A1 * | 2/2005 | Morrison | 250/442.11 |
| 2011/0127427 A1 * | 6/2011 | Nackashi et al. | 250/307 |
| 2011/0248165 A1 * | 10/2011 | Damiano et al. | 250/307 |
| 2013/0146784 A1 * | 6/2013 | Nackashi et al. | 250/440.11 |
| 2013/0206984 A1 * | 8/2013 | Nackashi et al. | 250/307 |

FOREIGN PATENT DOCUMENTS

| | | |
|---|---|---|
| KR | 20-1999-0027792 U | 7/1999 |
| KR | 2002-0096551 A | 12/2002 |
| KR | 10-2008-0075682 A | 8/2008 |
| KR | 10-2009-0022745 A | 3/2009 |
| KR | 10-2009-0096167 A | 9/2009 |

* cited by examiner

*Primary Examiner* — Michael Logie
*Assistant Examiner* — Wyatt Stoffa
(74) *Attorney, Agent, or Firm* — Akerman LLP

(57) ABSTRACT

A specimen holder and method for controlling the same, which can mount and fasten a specimen to allow observation thereof by joining a body and a stand of the specimen holder together. The specimen holder includes: a body; a specimen mounting part formed at an end of the body for fixing a specimen; elasticity means located inside the body; and a stand detachably joined with the body. The stand includes: a base part; and a joining part protrudingly formed on the upper face of the base part and having a through hole to which at least a part of the specimen mounting part is inserted. The specimen mounting part includes: a first grip part located at an end portion of the specimen mounting part for fixing one side of the specimen; and a second grip part movably connected with the elasticity means for fixing the other side of the specimen.

6 Claims, 13 Drawing Sheets

SPECIMEN HOLDER FOR OBSERVING TOP SECTION OF SPECIMEN AND METHOD FOR CONTROLLING THE SAME

CROSS-REFERENCE TO RELATED APPLICATIONS

The present application claims priority to Korean Patent Application No. 10-2013-0110662, filed Sep. 13, 2013, the entirety of which is incorporated herein by reference.

BACKGROUND OF THE INVENTION

1. Field of the Invention

The present invention relates to a specimen holder which is used for observing the top section of a wafer specimen with a scanning electron microscope in order to judge whether or not there is a defect in a manufactured wafer and a method for controlling the specimen holder, and more particularly, to a specimen holder and a method for controlling the same, which can easily and rapidly mount a specimen and fasten the specimen in order to allow observation of the specimen by joining a body and a stand of the specimen holder together.

2. Background Art

In general, a process of manufacturing a semiconductor device repeatedly carries out a diffusion process, an oxidation process, a metallization process, and so on. Therefore, various kinds of materials, for instance, insulation films, such as a metal film of Al, Ti, W or others, a nitride film, an oxide film or others, on a wafer.

In the case that there is something wrong with some of the multiple laminated films, because the semiconductor device formed by the follow-up process may have a malfunction, technology to exactly and effectively analyze and verify such a malfunction is needed.

Due to an integration of the semiconductor device, the semiconductor device may have a malfunction by a minute cause, and it aggravates difficulty in analyzing the malfunction which may occur in the semiconductor device.

A transmission electron microscope (TEM) or a scanning electron microscope (SEM) may be used in order to analyze and verify the film or pattern formed on the wafer.

The transmission electron microscope is an apparatus for obtaining an image by electron beams transmitted through a specimen and analyzing a crystal structure of a phase by a diffraction pattern obtained through the diffracted electron beams.

The scanning electron microscope discharges a flow of electrons having acceleration energy (normal to 30 KV) using an electron gun and forms a focus of electron beams using various electromagnetic lenses, apertures and so on. A user scans the formed electron beams to a target sample to be observed and controls magnification. When secondary electrons, back scatter electrons, transmission electrons, characteristic X-rays formed from the target sample are detected, the user can observe the top section of the target sample and analyze characteristics of the top section of the target sample.

The scanning electron microscope basically includes an electron column, a sample chamber, a vacuum pump, a vacuum gauge, various controlling parts for controlling the electron column, and an image processing system. The electron column includes an electron gun, a lens, an aperture, a signal detector, and others, and the vacuum pump has a structure to form an ultra-high vacuum to remove various obstacles, such as scattering, discharge, and pollution of the electron beams by gas molecules in the air.

As the electron gun of the scanning electron microscope, there are thermionic emission guns, cold cathode field emission (CFE) guns, schottky field emission (SFE) guns, and others, and the scanning electron microscope is greatly varied in performance and structure according to kinds of the electron gun. Generally, the scanning electron microscope using the CFE gun and the SFE gun is called an FE-SEM (Field Emission Scanning Electron Microscope), and the scanning electron microscope using the thermionic emission gun is called a normal SEM.

The lens is divided into two kinds, namely, a condenser lens and an objective lens. The condenser lens first condenses electron beams emitted from the electron gun and forms the first focus, controls probe current arriving at the sample, and generally one or two condenser lenses are used. The objective lens is to accurately focus the electron beams formed in the condenser lens on the target sample, and has a scanning coil for controlling a scanning area of the electron beams scanned to the target sample and forming magnification.

The aperture is divided into a fixed type aperture and a variable type aperture which can vary a size of a hole. A plurality of the fixed type apertures are located inside the electron column by use according to design structures of manufacturers. The variable type aperture is generally called an objective lens aperture and is located on the objective lens in order to control a current amount of beams introduced into the objective lens, to regulate a size of the focus, and to reduce various aberrations.

When electron beams having acceleration voltage according to analysis purposes are scanned to the target sample from the electron column after being focused and reduced, backscattered electron (BSE) signals of the secondary electrons and incident beams are generated according to peculiar characteristics of the target sample. The signals are collected and amplified by the secondary electron detector or a BSE detector and contrast and brightness are applied to the signals according to signal quantities in order to process the image, so that the user can magnify and observe a morphological image of the top section of the target sample. Moreover, if characteristic X-rays of elements generated when the incident beams collide with the target sample are detected (EDXS), qualitative and quantitative analysis data can be obtained. Furthermore, if the transmission electron detector (STEM) is attached according to use purpose, various applications such as a structure analysis of the target sample can be made.

FIG. 1 is a view showing an out-lens and semi-in-lens type FE-SEM, and FIG. 2 is a view showing an in-lens type FE-SEM to which the present invention is applicable. The FE-SEM is utilizable in various fields, such as semiconductors, displays (LCDs, LEDs, OLEDs, and others), the rays of the sun, various Nano-materials, biology, medical science, electronics, machineries, physics, chemical materials, various materials, and material studies. The FE-SEM illustrated in FIGS. 1 and 2 includes an electron source 31, a beam monitor aperture 32, a first condenser lens 33, an air lock valve 34, an objective movable aperture 35, a second condenser lens 36, a deflection coil 37, an EXB 38, an objective lens 39, a secondary electron detector 45, and others. The In-lens type FE-SEM of FIG. 2 further includes an objective lens coil 40 and a beam blanking 41, and may further include a dark field STEM detector 42, a bright field aperture 43, and a bright field STEM detector 44. The out-lens and semi-in-lens type FE-SEM illustrated in FIG. 2 allows the user to observe samples of a large size because a specimen 11 is located below the objective lens and a working distance is long, but is deteriorated in image resolving power because the working distance is long. On the contrary, the In-lens type FE-SEM of FIG. 3 to which the present invention is applied allows the user to observe only samples of a small size because the specimen 11 is located inside the objective lens and the working distance is short, but can obtain an image of ultra-high resolving power.

In the meantime, a method of fixing the specimen 11 using tape or paste 12 is conventionally used as illustrated in FIG. 3. The tape may be a carbon tape, a copper tape, or an Al tape that has conductivity, and the paste 12 may be a liquid-state paste, such as silver paste or carbon paste, that has conductivity.

However, the conventional method using the tape has several problems in that the specimen may be unstably fixed by adhesion elasticity of the tape while the user is observing the specimen, in that an image flow phenomenon may occur due to an increase of electrification of electrons by a contact resistance, and in that image distortion and a variation in CD (Critical Dimension) may occur. Moreover, the conventional method using the tape has further problems in that it may cause an interference phenomenon to push the electrons at the time of observing the specimen, in that a minute transformation of the tape may have a great influence on the magnified image because the specimen must be magnified by tens of thousands, and in that an unclear image may be obtained because noise may be mixed into the detected signal. Furthermore, the conventional method using the tape has still further problems in that the specimen may be frequently separated from the vacuum chamber of the scanning electron microscope due to a poor adhesion of the tape, and in that the specimen may be damaged by the tape when the user removes the specimen after observing the specimen.

The conventional method using the paste has several problems in that it takes much time to work because the user can observe the specimen after adhering the paste to the specimen and drying the specimen for at least 20 minutes, in that the specimen may be polluted by the liquid-state paste, and in that it is difficult to obtain an accurate image. Additionally, the conventional method using the paste has further problems in that gas deposition of hydro-carbon may be generated in an observation area because the specimen chamber is polluted if the liquid-state paste is not completely dried, and hence, a contamination phenomenon of the observation pattern may be increased. Moreover, the conventional method using the paste has a still further problem in that the specimen may be damaged by the paste when the user removes the specimen after observing the specimen.

Therefore, a development of a specimen holder which can simply and easily fix the specimen and obtain a clear and clean image is required.

CITED REFERENCES

Cited Reference 1: Korean Patent Laid-open No. 10-2009-0022745
Cited Reference 2: Korean Utility Model Laid-open No. 20-1999-0027792
Cited Reference 3: Korean Patent Laid-open No. 10-2008-0075682
Cited Reference 4: Korean Patent Laid-open No. 10-2009-0096167

SUMMARY OF THE INVENTION

Accordingly, the present invention has been made to solve the above-mentioned problems occurring in the prior arts, and it is an object of the present invention to provide a specimen holder which is used for observing the top section of a wafer specimen with a scanning electron microscope in order to judge whether or not there is a defect in a manufactured wafer, and more particularly, to provide a specimen holder and a method for controlling the same, which can easily and rapidly mount a specimen and fasten the specimen in order to allow observation of the specimen by joining a body and a stand of the specimen holder together.

In detail, it is an object of the present invention to provide a specimen holder which can easily and effectively fix a specimen in the one-touch manner by joining a body and a stand of the specimen holder to mount the specimen and by separating the body from the holder to fix the specimen.

Moreover, it is another object of the present invention to provide a specimen holder which can obtain a clear and accurate magnified image by fixing the specimen without any transformation of the specimen.

In the meantime, the technical objects to be achieved by the present invention are not limited to the above-mentioned technical objects, and it will be understood by those of ordinary skill in the art that the above and other objects, features and advantages of the present invention will be apparent from the following detailed description of the preferred embodiments of the invention in conjunction with the accompanying drawings.

To achieve the above objects, the present invention provides a specimen holder for observing the top section of a specimen including: a body; a specimen mounting part formed at an end of the body for fixing a specimen; elasticity means located inside the body; and a stand detachably joined with the body, wherein the stand includes: a base part forming a lower part of the stand; and a joining part protrudingly formed on the upper face of the base part and having a through hole to which at least a part of the specimen mounting part is inserted, the specimen mounting part includes: a first grip part located at an end portion of the specimen mounting part for fixing one side of the specimen; and a second grip part movably connected with the elasticity means for fixing the other side of the specimen using elasticity of the elasticity means, in the case that the body is joined to the stand and at least a part of the specimen mounting part is inserted into the through hole, the second grip part moves to compress the elasticity means and a first space is formed between the first grip part and the moved second grip part, and in the case that the body is separated from the stand after the specimen is mounted in the first space, the second grip part is moved by elasticity of the elasticity means and the moved second grip part fixes the other side of the specimen.

Moreover, the specimen is fixed in the first space in such a manner that the top section of the specimen faces upward, and the user can observe the top section of the fixed specimen using a scanning electron microscope.

Furthermore, the specimen holder according to the present invention further includes a retaining member connected with the joining part and having a retaining protrusion, the retaining protrusion stopping at least a part of the through hole formed in the joining part.

Additionally, the second grip part has a stepped portion protruding outward.

In addition, in the case that the body is joined to the stand and at least a part of the specimen mounting part is inserted into the through hole, the stepped portion formed on the second grip part is caught to the retaining protrusion, such that the second grip part is moved.

Moreover, the specimen holder according to the present invention further includes a hand-grip part formed at the other end of the body.

Furthermore, the stand further includes a support protrudingly formed on the upper face of the base part, and at least a part of the hand-grip part is held on the upper face of the support.

Additionally, the support includes a fixing protrusion formed on the upper face thereof and protruding outward.

In addition, the hand-grip part further includes a fixing groove formed inwardly, and when the fixing groove of the hand-grip part is joined to the fixing protrusion of the support, the body is fixed to the stand.

Moreover, the support includes: a support prop forming a lower part of the support; and a support top portion having a lever protruding outward, the support top portion being joined with the support prop by a support screw and being rotatable on the support screw within a range of a predetermined angle. When a power to press the lever is applied, the support top portion lowers down while rotating on the support screw by the power applied to the lever, and the body joined to the stand is separated from the stand using the lowered support top portion.

Furthermore, the support further includes an elastic portion for connecting the support prop and the support top portion. When the power which presses the lever is removed, the support top portion ascends while rotating on the support screw by elasticity of the elastic portion.

Additionally, the stand further includes a holder protrudingly formed on the upper face of the base part, so that at least a part of the body is held on the holder.

In addition, the second grip part includes: a flat plate for fixing the other side of the specimen; and a push rod connected with the elasticity means.

Moreover, one side of the first grip part getting in contact with one side of the specimen is inclined at a first angle, and one side of the flat plate getting in contact with the other side of the specimen is inclined at a second angle.

In another aspect of the present invention, the present invention provides a method for controlling a specimen holder for observing the top section of a specimen including: a first step of joining a body to a stand; a second step of mounting a specimen in a first space; and a third step of separating the body from the stand. The first step includes the steps of: inserting at least a part of the specimen mounting part into a through hole; moving a second grip part; and forming the first space between a first grip part and the moved second grip part. The specimen mounting part is formed at an end of the body for fixing the specimen and includes the first grip part and the second grip part, wherein the first grip part fixes one side of the specimen and the second grip part fixes the other side of the specimen. The through hole is formed in a joining part located on the upper face of a base part and at least a part of the specimen mounting part is inserted into the through hole, and the base part forms a lower part of the stand.

As described above, the present invention can provide the specimen holder which is used for observing the top section of a wafer specimen with a scanning electron microscope in order to judge whether or not there is a defect in a manufactured wafer, and more particularly, provide the specimen holder and the method for controlling the same, which can easily and rapidly mount a specimen and fasten the specimen in order to allow observation of the specimen by joining the body and the stand of the specimen holder together.

In detail, the present invention can provide specimen holder which can easily and effectively fix a specimen in the one-touch manner by joining a body and a stand of the specimen holder to mount the specimen and by separating the body from the holder to fix the specimen.

Moreover, the present invention can provide the specimen holder which can obtain a clear and accurate magnified image by fixing the specimen without any transformation of the specimen.

In the meantime, the technical objects to be achieved by the present invention are not limited to the above-mentioned technical objects, and it will be understood by those of ordinary skill in the art that the above and other objects, features and advantages of the present invention will be apparent from the following detailed description of the preferred embodiments of the invention in conjunction with the accompanying drawings.

BRIEF DESCRIPTION OF THE DRAWINGS

For the purposes of illustrating the preferred embodiment of the present invention and better understanding of the technical idea of the present invention, reference is now made to the following descriptions taken in conjunction with the accompanying drawings. It should be understood, however, that the present invention is not limited to the matters illustrated in the drawings, in which.

DETAILED DESCRIPTION OF THE PREFERRED EMBODIMENT

Reference will be now made in detail to the preferred embodiment of the present invention with reference to the attached drawings. It will be understood that the present invention is not restricted to the embodiment described hereinafter and that not all the components described in the embodiment are essential for the present invention.

In a general manufacturing process of semiconductor devices, a specimen holder is an essential device for fixing a specimen in analysis and inspection of a wafer using a scanning electron microscope.

However, the conventional method of fixing a specimen using tape or paste has several problems in that it is difficult to obtain a precise and clear image because noise is generated on a magnified image and in that it is complicated and it takes much time.

Moreover, the conventional method of fixing the specimen using a screw device has several problems in that it may damage the specimen and deteriorates workability.

The present invention is to propose a specimen holder which can provide an effective process of manufacturing semiconductor devices by easily and simply fixing the specimen. Furthermore, the present invention is to propose a specimen holder which can reduce a defect rate of the semiconductor devices by obtaining a clear and accurate magnified image.

Hereinafter, the specimen holder 10 used for observing the top section of the specimen according to the present invention will be described in detail.

<Structure of Specimen Holder Used for Observing Top Section of Specimen>

Hereinafter, referring to FIGS. 4 and 5, the general structure of the specimen holder 10 used for observing the top section of the specimen according to the present invention will be described.

Figure 1:
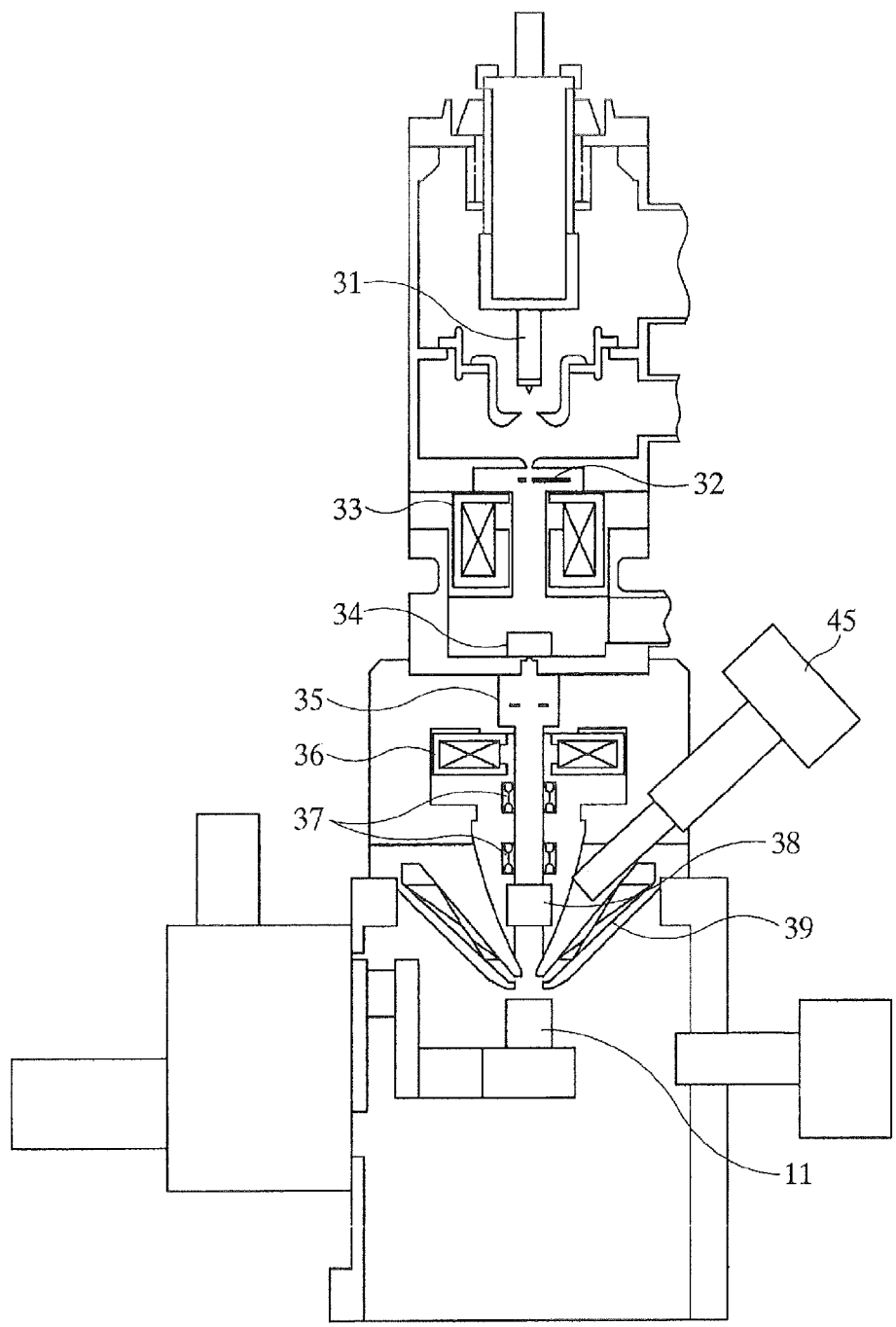
FIG. 1 is a view showing an out-lens and semi-in-lens type FE-SEM.
Figure 2:
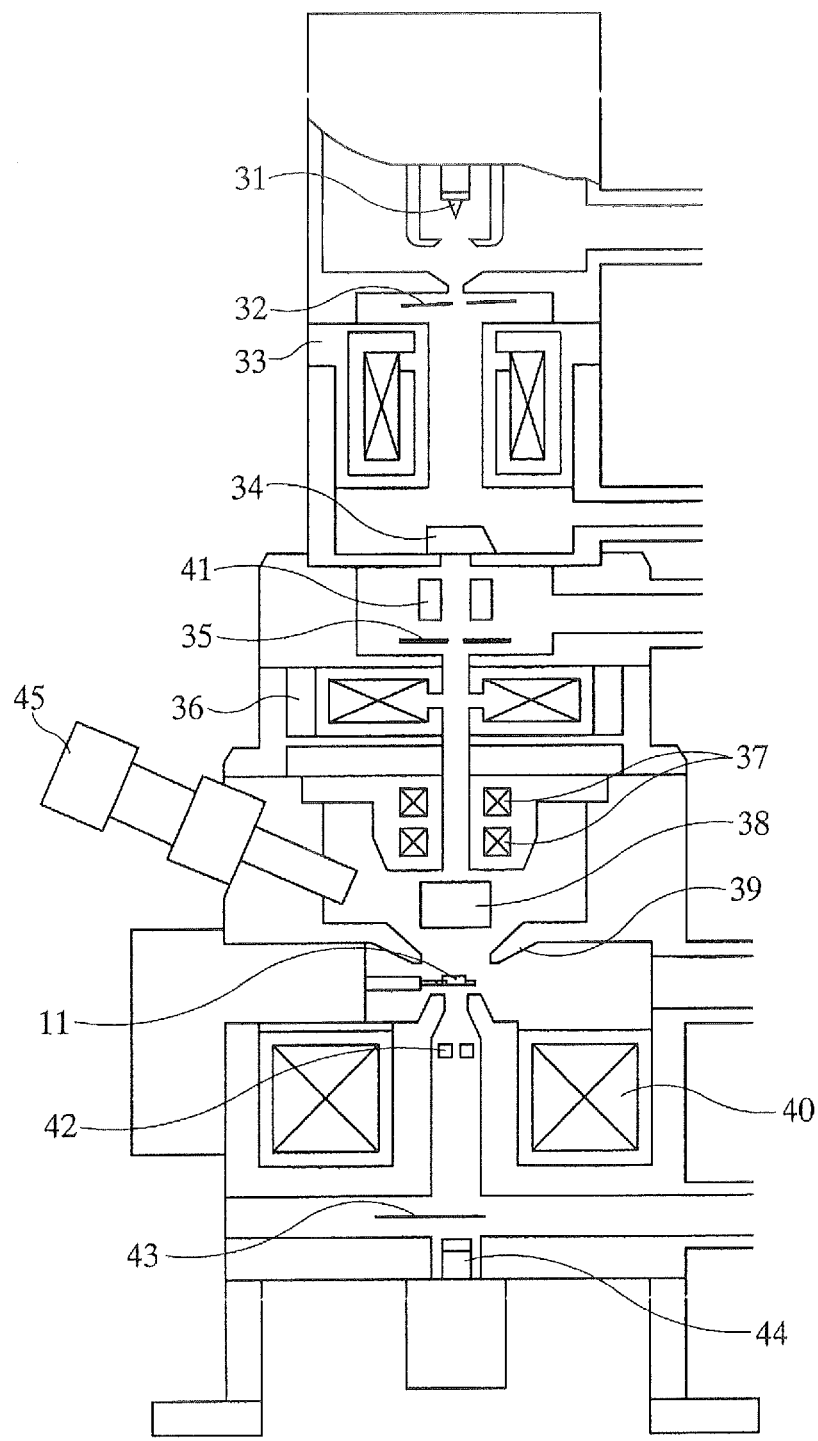
FIG. 2 is a view showing an in-lens type FE-SEM.
Figure 3:
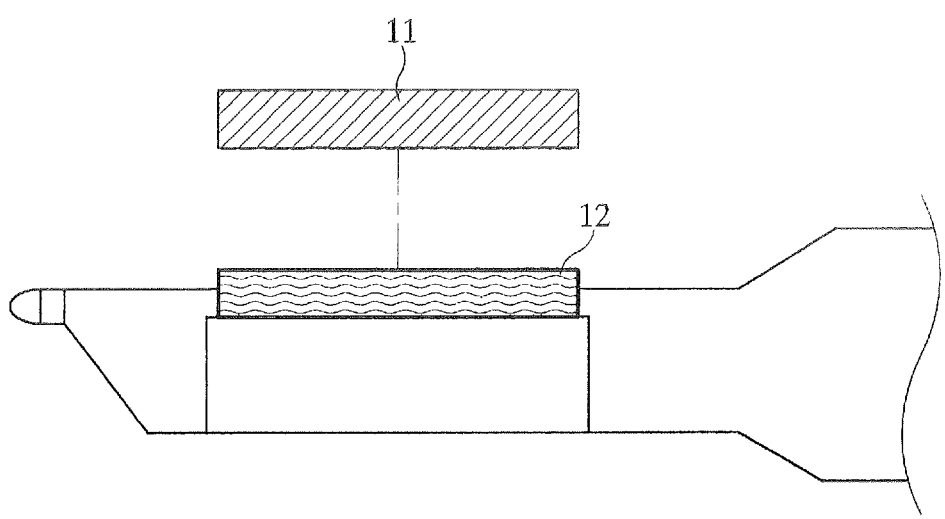
FIG. 3 is a view showing an example of a specimen holder which fixes a specimen using tape or paste according to a prior art.
Figure 4:
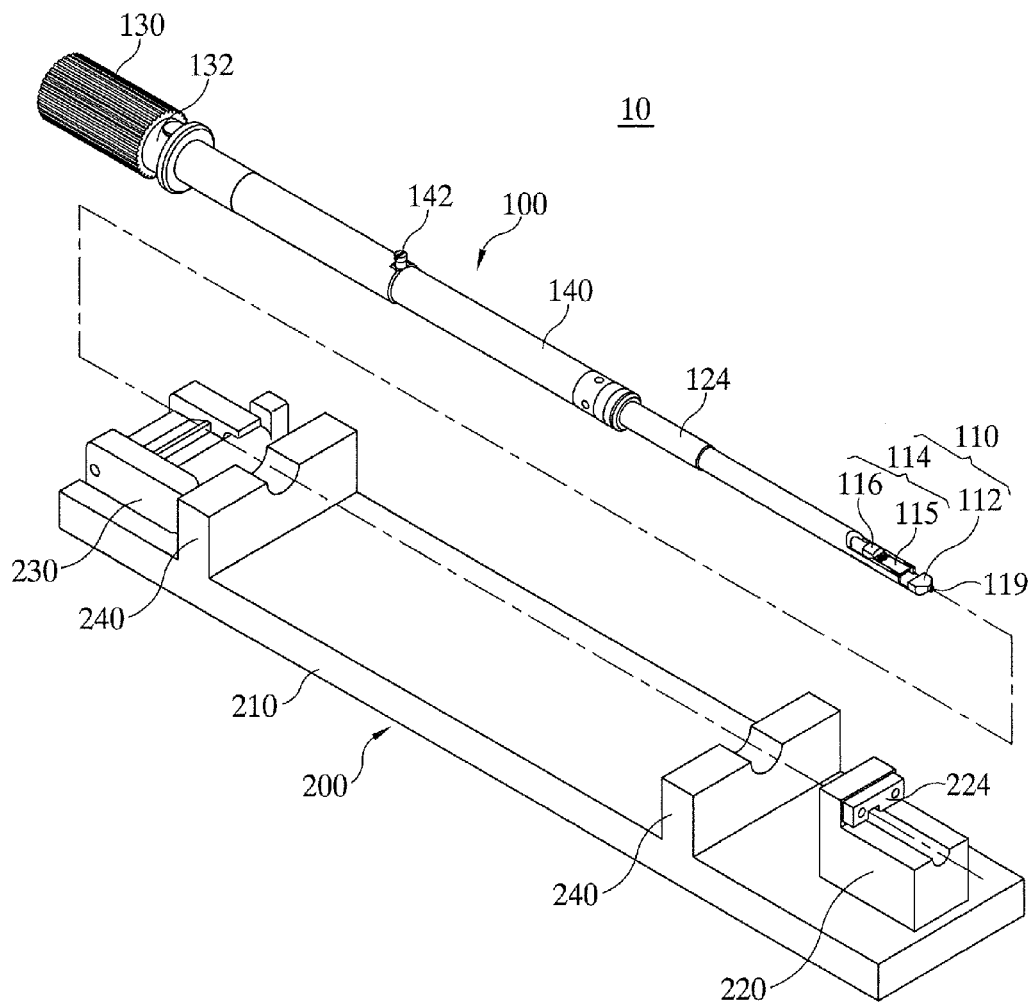
FIG. 4 is a perspective view showing a state where a body and a stand of a specimen holder used for observing the top section of a specimen according to the present invention are not joined together.
Figure 5:
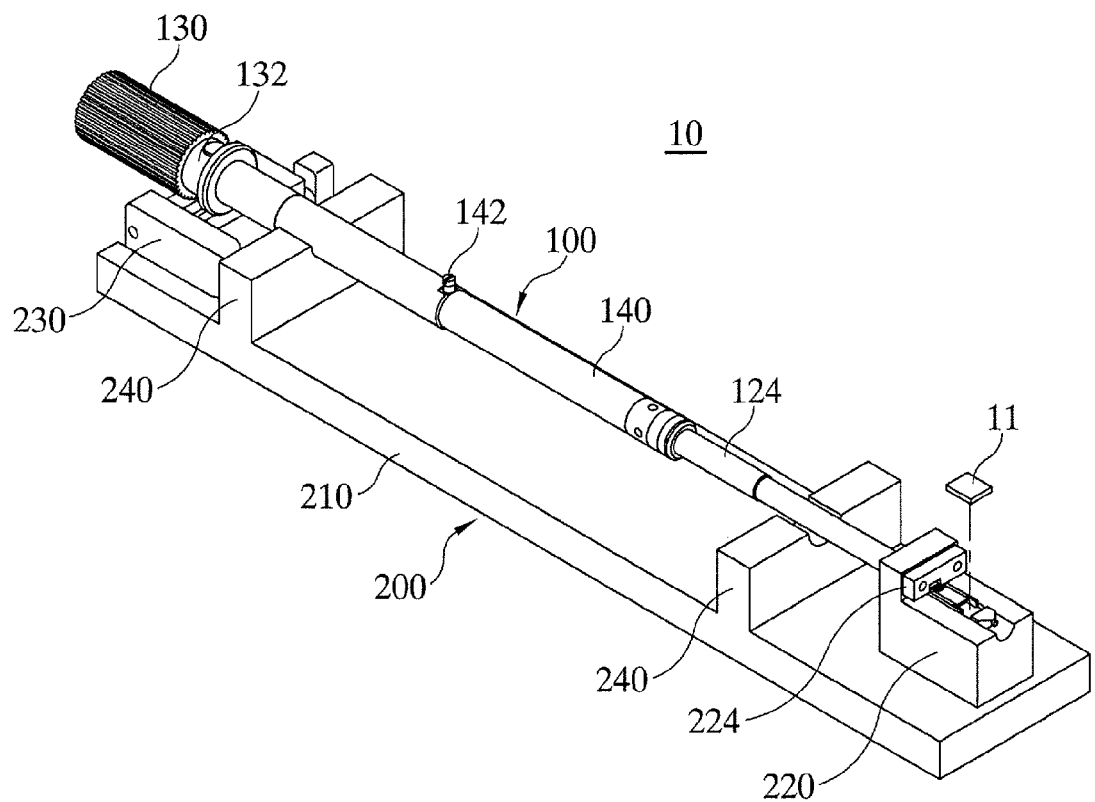
FIG. 5 is a perspective view showing a state where the body and the stand of the specimen holder according to the present invention are joined together.

FIG. 4 is a perspective view showing a state where a body and a stand of a specimen holder used for observing the top section of a specimen according to the present invention are not joined together, and FIG. 5 is a perspective view showing a state where the body and the stand of the specimen holder according to the present invention are joined together.

Referring to FIGS. 4 and 5, the specimen holder 10 used for observing the top section of the specimen according to the present invention includes a body 100 and a stand 200.

The body 100 includes a specimen mounting part 110 for stably fixing a specimen 11, and a user can observe the specimen fixed on the specimen mounting part 110 using a scanning electron microscope. Moreover, the body 100 includes a hand-grip part 130 for allowing the user to grasp the body 100, a joining member 140 for connecting the specimen mounting part 110 and the hand-grip part 130 with each other, and a housing 124.

The stand 200 may be detachably joined to the body 100. In the case that the stand 200 is joined to the body 100, the specimen 11 can be mounted to the specimen mounting part 110 of the body 100. In the case that the stand 200 joined with the body 100 is separated from the body 100, the specimen 11 can be fixed to the specimen mounting part 110 of the body 100.

The stand 200 includes a joining part 220, and the joining part 220 has a hole to which at least a part of the specimen mounting part 110 is inserted. Additionally, the stand 200 further includes a support 230 for holding the hand-grip part 130 of the body 100, and a holder 240 for holding a part of the joining member 140 or the housing 124.

Hereinafter, the structure of the specimen holder 10 used for observing the top section, which includes the body 100 and the stand 200, according to the present invention will be described in detail.

Figure 6:
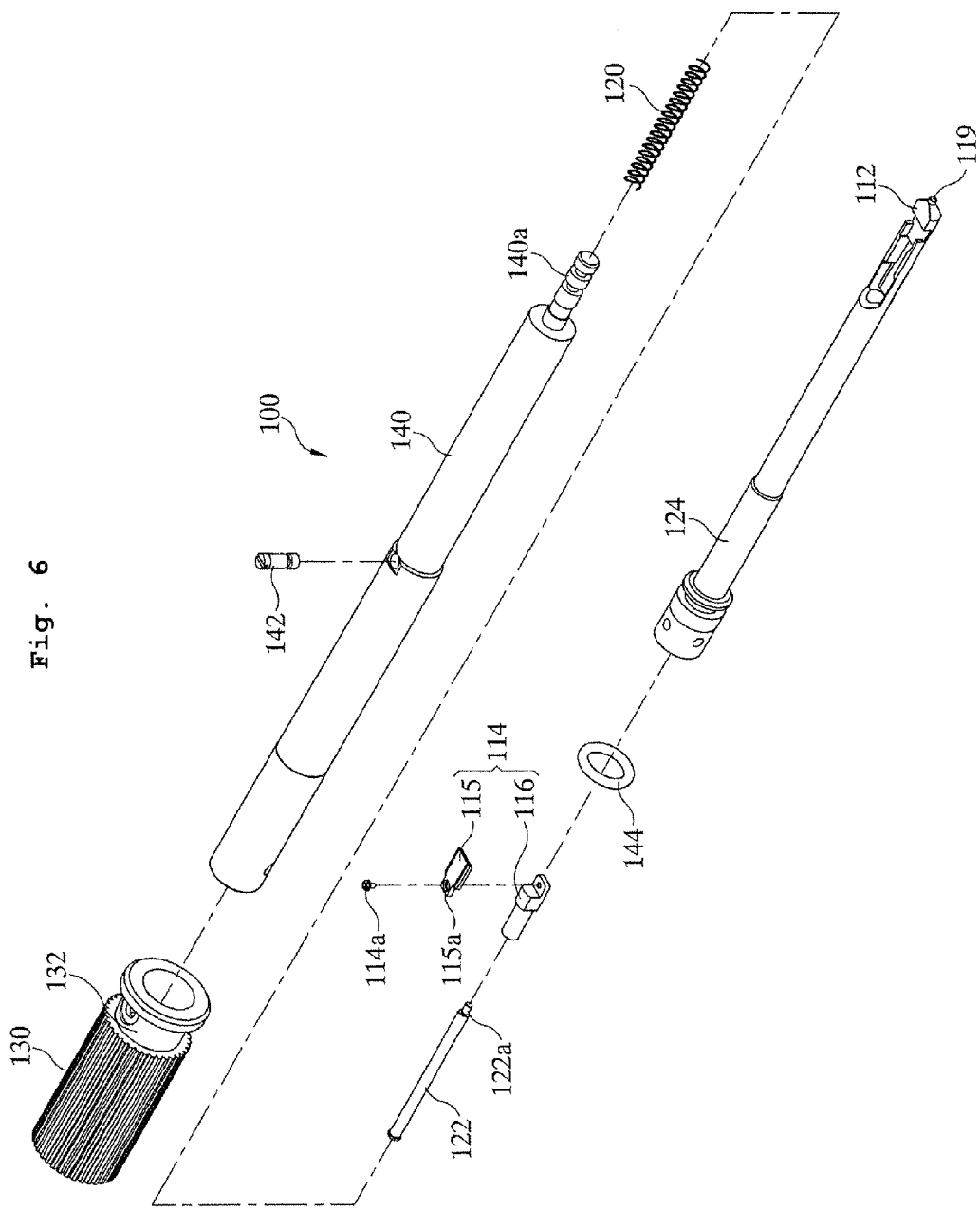
FIG. 6 is an exploded view showing a joining relationship of the body of the specimen holder for observing the top section of the specimen according to the present invention.
Figure 7:
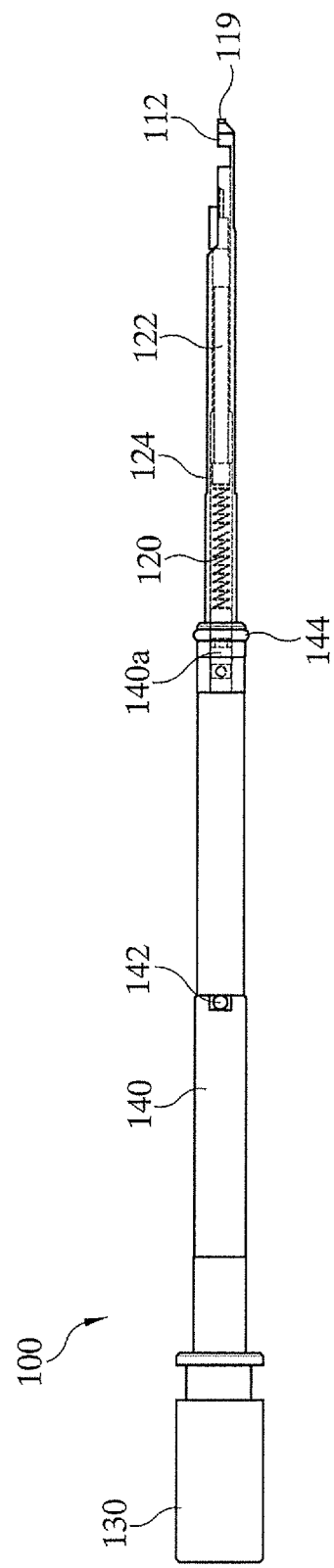
FIG. 7 is a side sectional view of the body of the specimen holder for observing the top section of the specimen according to the present invention.

First, referring to FIGS. 6 to 8, the structure of the body 100 of the specimen holder 10 used for observing the top section according to the present invention will be described in detail. FIG. 6 is an exploded view showing a joining relationship of the body of the specimen holder for observing the top section of the specimen according to the present invention, and FIG. 7 is a side sectional view of the body of the specimen holder for observing the top section of the specimen according to the present invention.

The body 100 of the specimen holder 10 used for observing the top section according to the present invention is in the shape of a long tube, and includes the specimen mounting part 110, elasticity means 120, the hand-grip part 130, and the joining member 140. However, the components illustrated in FIGS. 6 and 7 are not essential, and the body 100 may include more components or less components. Hereinafter, the components will be described in more detail.

The specimen mounting part 110 is formed at one end of the body 100. It is important to firmly fix the specimen 11 because the scanning electron microscope to which the present invention is applied largely magnifies the specimen 11. In order to precisely observe the specimen 11, the specimen mounting part 110 can mount the specimen 11 and firmly fix the mounted specimen 11. Because both sides of the specimen 11 are fixed to the specimen mounting part 110, the top section of the specimen 11 faces upwards and the user can observe the top section of the specimen 11 using the scanning electron microscope.

The specimen mounting part 110 includes a fixed first grip part 112 and a movable second grip part 114. The second grip part 114 includes a flat plate 115 and a push rod 116. In the case that the specimen mounting part 110 is opened and a first space is formed between the first grip part 112 and the second grip part 114 and the specimen 11 is mounted in the first space, the specimen 11 can be fixed by the first grip part 112 and the second grip part 114.

The first grip part 112 is fixed to an end portion of the specimen mounting part 110, and as shown in FIGS. 4 and 5, may be formed integrally with the specimen mounting part 110. The first grip part 112 can fix one side of the specimen 11. One side of the first grip part 112 meeting with one side of the specimen may be inclined so as to easily fix the specimen 11, for instance, inclined at an angle of 60 degrees.

The second grip part 114 is connected with the elasticity means 120 through connecting means 122, and is movable by the external force. The other side of the specimen 11 can be fixed by the second grip part 114.

Because the first grip part 112 fixes one side of the specimen 11 and the second grip part 114 fixes the other side of the specimen 11, the top section of the specimen 11 faces upwards. Therefore, the user can observe the top section of the specimen 11 by joining the specimen mounting part 110 to the scanning electron microscope.

Meanwhile, referring to FIG. 8, the structure of the second grip part 114 of the specimen mounting part 110 will be described in detail. FIG. 8 is an exploded view of the second grip part of the specimen holder for observing the top section of the specimen according to the present invention.

Figure 8:
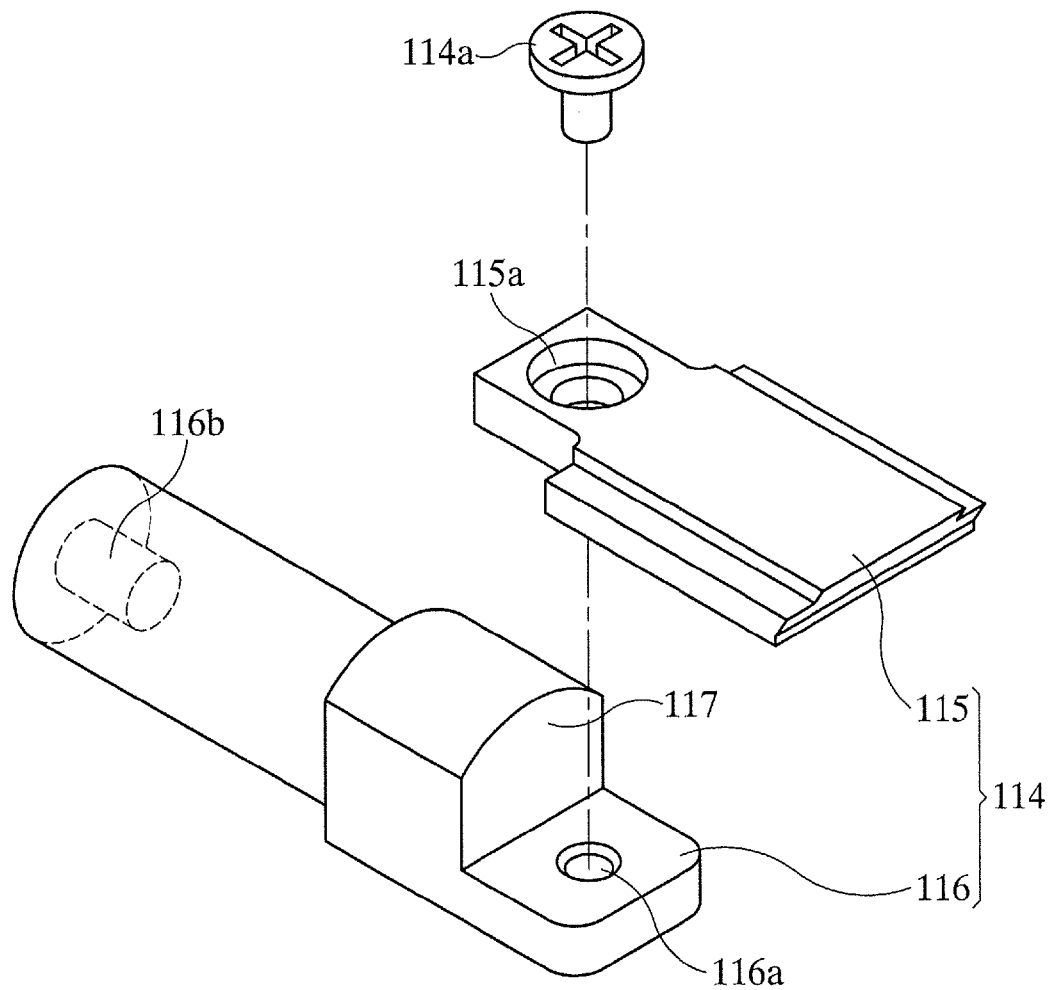
FIG. 8 is an exploded view of a second grip part of the specimen holder for observing the top section of the specimen according to the present invention.

As shown in FIG. 8, the second grip part 114 is formed by the flat plate 115 and the push rod 116 joined together by a second grip part screw 114a.

As shown in FIG. 8, the flat plate 115 of the second grip part 114 is in the shape of a flat rectangle, but is not limited to the above-mentioned shape of the flat plate 115 and the shape of the flat plate 115 may be varied into various shapes.

The flat plate 115 of the second grip part 114 gets in contact with one side of the specimen 11 so as to fix the specimen 11. The side of the specimen 11 which is in contact with the flat plate 115 may be inclined so as to easily fix the specimen 11, for instance, inclined at an angle of 60 degrees. The flat plate 115 has a flat plate fitting recess 115a, and the flat fitting recess 115a has an upper portion larger than a lower portion thereof. The flat fitting recess 115a engages with a first push rod fitting hole 116a of the push rod 116, such that the flat plate 115 and the push rod 116 are joined together.

The push rod 116 of the second grip part 114 may be formed in the shape illustrated in FIG. 8. However, the structure of the push rod 116 applicable to the present invention is not limited to the above and may be changed into various shapes.

The push rod 116 has the first push rod fitting hole 116a formed at an end portion thereof. The first push rod fitting hole 116a engages with the flat plate fitting recess 115a of the flat plate 115, and the flat plate 115 and the push rod 116 are joined together when a joining device such as the second grip part screw 114a is inserted into the first push rod fitting hole 116a and the flat plate fitting recess 115a. The push rod 116 has a second push rod fitting hole 116b formed at the other end portion thereof. A connecting means fitting protrusion 122a formed at an end of the connecting means 122 may be inserted into the second push rod fitting hole 116b. When the connecting means fitting protrusion 122a is inserted into the second push rod fitting hole 116b, the second grip part 114 and the connecting means 122 are joined together.

An outwardly protruding stepped portion 117 is formed on the upper portion of the push rod 116. The stepped portion 117 has a height that it can be in contact with a retaining protrusion 225 of a retaining member 224 which stops a part of a through hole 222.

Referring to FIGS. 6 and 7, a funnel-shaped specimen mounting part 110 has a hole formed at an end portion thereof, and a tip portion 119 made of natural sapphires is adhered at the hole using quick-drying glue. Moreover, the scanning electron microscope to which the present invention is applied also has a funnel-shaped space to which the end portion of the specimen mounting part 110 can be inserted. The tip portion of the funnel-shaped space of the scanning electron microscope is also made of sapphires. When the end portion of the specimen mounting part 110 is inserted into the scanning electron microscope, the tip portion 119 made of sapphires and the sapphire material portion of the scanning electron microscope meet together. Therefore, the specimen mounting part 110 can firmly fixed to the scanning electron microscope without slip from the scanning electron microscope, and the user can precisely observe the specimen 11.

Meanwhile, the elasticity means 120 has elasticity like a spring and is located inside the housing 124 of the body 100. One side of the elasticity means 120 is connected to a joining member fitting portion 140a formed at an end of the joining member 140, and the other side is connected with the second grip part 114.

As shown in FIGS. 6 and 7, the connecting means 122 is interposed between the other side of the elasticity means 120 and the second grip part 114. The connecting means fitting protrusion 122a is formed at an end of the connecting means 122 and is inserted into the second push rod fitting hole 116b of the push rod 116. The other end of the connecting means 122 is directly or indirectly connected with the elasticity means 120.

Because the second grip part 114 is connected with the elasticity means 120, in the case that the external force is applied to the second grip part 114, the second grip part 114 is movable back and forth. That is, in the case that the external force is applied to a part of the second grip part 114, the elasticity means 120 is compressed and the second grip part 114 moves back so as to form the first space. When the external force applied to the second grip part 114 is removed, the second grip part 114 moves to the original position by elasticity of the elasticity means 120.

In the meantime, the hand-grip part 130 may be located at the other end of the body 100 which is opposed to the specimen mounting part 110. The hand-grip part 130 is made of rubber or plastic material, such that the user can conveniently grasp the body 100 with the hand, and the hand-grip part 130 has a uneven surface such that the user can easily grasp the hand-grip part 130.

The hand-grip part 130 includes a fixing groove 132 formed inwardly, and the fixing groove 132 is joined with a fixing protrusion 233 of the support 230.

Meanwhile, the joining member 140 connects the hand-grip part 130 of the body 100 with the housing 124 and is formed in a tubular shape. The joining member 140 has proper length and thickness according to the standards of the scanning electron microscopes to which the present invention is applied.

The joining member 140 has a joining member fitting portion 140a formed at an end thereof. The joining member fitting portion 140a is connected to the housing 124 surrounding the elasticity means 120 and is detachably attached to the housing 124. The joining member fitting portion 140a serves to block the air so that the chamber of the scanning electron microscope can keep a vacuum state. Moreover, the joining member 140 further includes an O-ring 144 disposed at a connection end between the joining member 140 and the housing 124, and the O-ring 144 serves to block the outside air so that the chamber of the scanning electron microscope can keep the vacuum state.

The joining member 140 has a position pin 142 protruding outward. The position pin 142 serves to guide the specimen holder 10 so that the specimen holder 10 used for observing the top section of the specimen is correctly mounted to the scanning electron microscope. In other words, the position pin 142 moves along guide rails mounted on the scanning electron microscope, such that the specimen 11 can be mounted at an exact position inside the chamber of the scanning electron microscope.

The housing 124 of the specimen holder 10 used for observing the top section of the specimen according to the present invention is made of a copper-based material of phosphorous bronze. That is, the housing 124 is made of a unmagnetized material in order to prevent a unfocused phenomenon by magnetism when the scanning electron microscope is used. The elasticity means 120 located inside the housing 124 is also made of phosphorous bronze material. Components disposed inside the body 100 are made of brass material. The joining member 140 is made of aluminum material.

Figure 9:
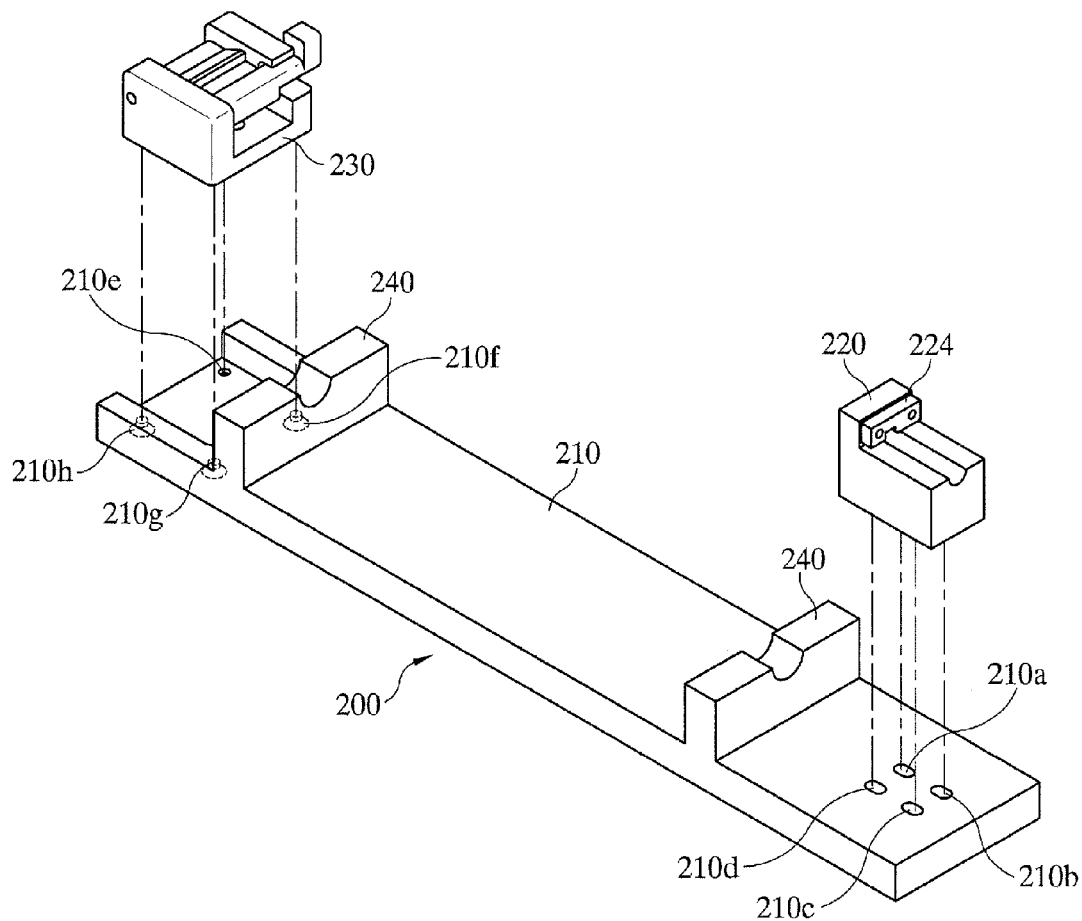
FIG. 9 is an exploded view showing a joining relationship of the stand of the specimen holder for observing the top section of the specimen according to the present invention.

Next, referring to FIGS. 9 to 12, the stand 200 of the specimen holder used for observing the top section of the specimen according to the present invention will be described in detail. FIG. 9 is an exploded view showing a joining relationship of the stand of the specimen holder for observing the top section of the specimen according to the present invention, and FIG. 10 is a side sectional view of the stand of the specimen holder for observing the top section of the specimen according to the present invention.

Figure 10:
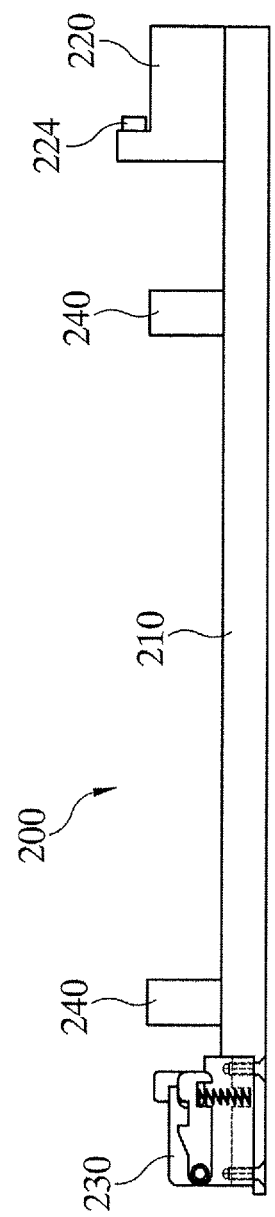
FIG. 10 is a side sectional view of the stand of the specimen holder for observing the top section of the specimen according to the present invention.

Referring to FIGS. 9 and 10, the stand 200 of the specimen holder used for observing the top section of the specimen according to the present invention is formed in the shape of a long rectangular parallelepiped, and includes a base part 210, a joining part 220, a support 230, and a holder 240. However, the components illustrated in FIGS. 9 and 10 are not essential, and the stand 200 may include more components or less components. Hereinafter, the components of the stand 200 will be described in order.

The base part 210 forms a lower part of the stand 200 and serves to support the stand 200. As shown in FIGS. 9 and 10, the base part 210 is formed in the shape of a rectangular parallelepiped. However, the base part 210 of the present invention is not limited to the shape of FIGS. 9 and 10, but may have another shape.

The upper face and the lower face of the base part 210 are even so that the user can perform work on the ground, and the main components, such as the joining part 220, the support 230, and the holder 240, of the stand 200 are protrudingly formed on the upper face of the base part 210.

The base part 210 has holes 210a, 210b, 210c and 210d which are joined with the joining part 220 and holes 210e, 210f, 210g, and 210h which are joined with the support 230. The holes 210a, 210b, 210c and 210d which are joined with the joining part 220 are designed to correspond with joining holes located at the bottom of the joining part 220. Moreover, the holes 210e, 210f, 210g, and 210h which are joined with the support 230 are designed to correspond with joining holes located at the bottom of the support 230. As shown in FIG. 8, the holes 210a to 210h respectively have lower portions larger than upper portions thereof. Joining units such as screws are respectively inserted into the holes 210a to 210h, so that the base part 210 can be joined to the joining part 220 or the support 230.

Meanwhile, the joining part 220 is protrudingly formed on the upper face of an end of the base part 210. In detail, in the case that the body 100 and the stand 200 are joined together, the joining part 220 is formed at the portion where the specimen mounting part 110 of the body 100 is located.

Figure 11:
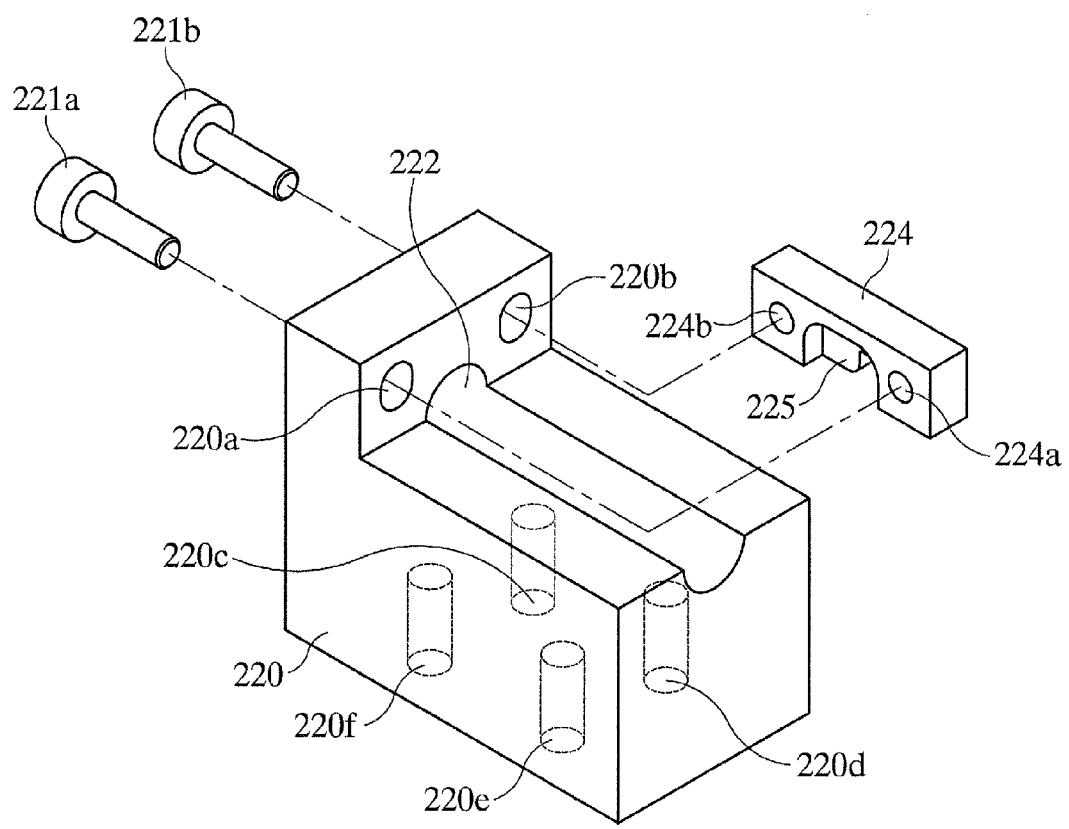
FIG. 11 is an exploded view of a joining part of the specimen holder for observing the top section of the specimen according to the present invention.

Referring to FIG. 11, the structure of the joining part 220 will be described in detail. FIG. 11 is an exploded view of a joining part of the specimen holder for observing the top section of the specimen according to the present invention.

The joining part 220 includes the through hole 222 to which at least a part of the specimen mounting part 110 is inserted. The through hole 222 of the joining part 220 is designed to have a proper size for inserting the specimen mounting part 110 thereinto. In the case that at least a part of the specimen mounting part 110 is inserted into the through hole 222 of the joining part 220, the specimen mounting part 110 is opened and the first space is formed. The user can mount the specimen 11 in the first space using a tool such as tweezers.

As shown in FIG. 11, the joining part 220 has a semicircular recess formed on the upper face thereof, and the semicircular recess may have the same shape as the through hole 222. Therefore, a part of the specimen mounting part 110 inserted into the through hole 222 advances to the semicircular recess formed on the upper face of the joining part 220.

The joining part 220 includes a first joining part fitting hole 220a and a second joining part fitting hole 220b. The first joining part fitting hole 220a and the second joining part fitting hole 220b are provided to join the joining part 220 with the retaining member 224 which will be described later.

The retaining member 224 has the retaining protrusion 225 for stopping at least a part of the through hole 222 of the joining part 220. In the case that the specimen mounting part 110 is inserted into the through hole 222, the retaining protrusion 225 of the retaining member 224 gets in contact with the stepped portion 117 of the push rod 116. When the retaining protrusion 225 of the retaining member 224 gets in contact with the stepped portion 117, the progress of the second grip part 114 is stopped, and the second grip part 114 moves backward while compressing the elasticity means 120. Therefore, the first space is formed between the moved second grip part 114 and the fixed first grip part 112, and the user can mount the specimen 11 in the first space using the tweezers.

Furthermore, the retaining member 224 has a first retaining member fitting hole 224a and a second retaining member fitting hole 224b. The first retaining member fitting hole 224a and the second retaining member fitting hole 224b respectively engage with the first joining part fitting hole 220a and the second joining part fitting hole 220b of the joining part 220, and when joining devices such as joining screws 221a and 221b are respectively inserted into the fitting holes, the joining part 220 and the retaining member 224 are joined together.

The joining part 220 has a third joining part fitting hole 220c, a fourth joining part fitting hole 220d, a fifth joining part fitting hole 220e, and a sixth joining part fitting hole 220f formed in the lower face thereof. The third to sixth joining part fitting holes 220c to 220f respectively engage with the holes 210a, 210b, 210c and 210d formed in an end of the base part 210, and when joining devices such as screws are respectively inserted into the fitting holes, the joining part 220 is joined to the base part 210.

In the meantime, referring to FIGS. 9 and 10, the support 230 is protrudingly formed on the upper face of the other end of the base part 210. In detail, in the case that the body 100 and the stand 200 are joined together, the support 230 is formed at the part where the hand-grip part 130 of the body 100 is located. Because the hand-grip part 130 of the body 100 is held on the support 230, the support 230 is formed on the opposite side of the joining part 220. An interval between the support 230 formed on the upper face of the base part 210 and the joining part 220 is designed to correspond to the length of the body 100. Additionally, in the case that the body 100 and the stand 200 are joined together, the body 100 is held horizontally. Therefore, heights of the support 230 and the joining part 220 which protrude are designed in such a manner that the body 100 settles horizontality.

Figure 12:
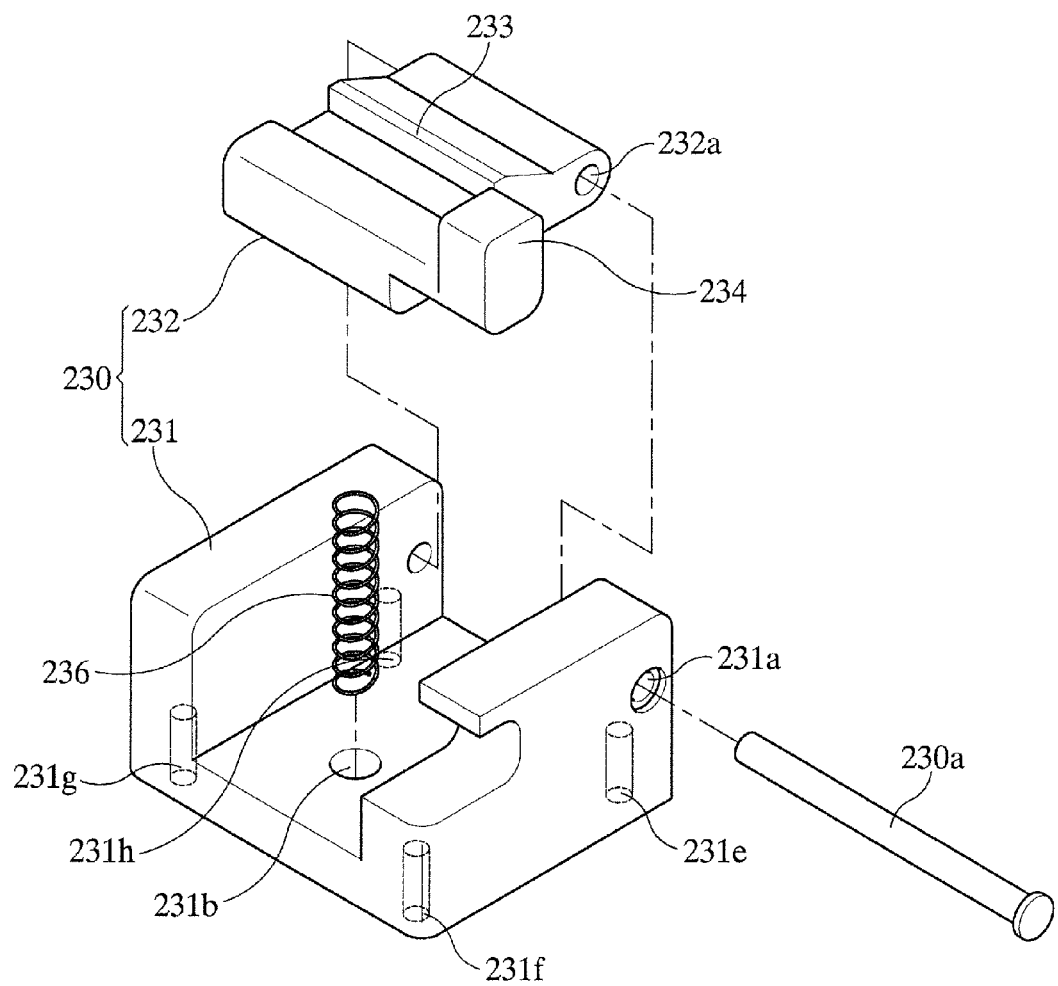
FIG. 12 is an exploded view of a support of the specimen holder for observing the top section of the specimen according to the present invention.

Referring to FIG. 12, the structure of the support 230 will be described in detail. FIG. 12 is an exploded view of the support of the specimen holder for observing the top section of the specimen according to the present invention.

As shown in FIG. 12, the support 230 for holding the hand-grip part 130 of the body 100 includes a support prop 231 and a support top portion 232 which are joined together.

The support prop 231 has a lever hole 231a, and the lever hole 231a engages with a rotation hole 232a formed in the support top portion 232, such that the support prop 231 and the support top portion 232 are joined together. Moreover, the support prop 231 has a spring hole 231b, and an elastic portion 236 connected with the support top portion 232 is connected to the spring hole 231b.

The support top portion 232 has the rotation hole 232a, and the rotation hole 232a engages with the lever hole 231a of the support prop 231, and when joining devices such as support screws 230a are respectively inserted into the holes, the support prop 231 and the support top portion 232 are joined together. The support top portion 232 is connected rotatably on the support screw 230a at a predetermined angle.

The support top portion 232 has the fixing protrusion 233 protrudingly formed on the upper face thereof. The fixing protrusion 233 engages with the fixing groove 132 of the hand-grip art 130, such that the body 100 can be firmly joined to the stand 200. Therefore, the fixing protrusion 233 has the shape corresponding with the fixing groove 132 formed inwardly. There is no need that the shape of the fixing protrusion 233 is the same as the fixing groove 132, and if the fixing protrusion 233 has a structure that the fixing protrusion 233 can be joined to the fixing groove 132, any shape of the fixing protrusion 233 is possible. When the fixing protrusion 233 and the fixing groove 132 are joined together, the body 100 and the stand 200 can be more easily and conveniently joined together.

Additionally, the support top portion 232 has a lever 234, and the elastic portion 236, such as a spring, connected thereto. The lever 234 formed protrudingly outward from the support top portion 232, and the user can press it with the hand. When the user presses the lever 234, the support top portion 232 lowers down while downwardly rotating on the support screw 230a, and hence, the hand-grip part 130 held on the support 230 is separated from the support 230. After the hand-grip part 130 is separated from the support 230, when the user releases the power to press the lever 234, the support top portion 232 returns to the original position by elasticity of the elastic portion 236. In other words, when the user releases the pressing power onto the lever 234, the support top portion 232 returns to the original position while upwardly rotating on the support screw 230a. As described above, when the user presses the lever 234 formed on the support top portion 232 to separate the hand-grip part 130 from the support 230, the body 100 and the stand 200 are more easily and conveniently separated from each other.

The support prop 231 has a first support prop fitting hole 231c, a second support prop fitting hole 231d, a third support prop fitting hole 231e, and a fourth support prop fitting hole 231f which are respectively formed in the lower portion thereof. The first to fourth support prop fitting holes 231c to 231f respectively engage with the holes 210e, 210f, 210g and 210h formed in the upper face of the base part 210, and when joining devices such as screws are respectively inserted thereinto, the support 230 and the base part 210 can be joined together.

In the meantime, referring to FIGS. 9 and 10, the holder 240 serves to hold the body 100 when the body 100 is joined to the stand 200, and is protrudingly formed on the upper face of the base part 210. A plurality of the holders 240 may be formed, and preferably, they are formed between the joining part 220 and the support 230. In FIGS. 9 and 10, the stand 200 has two holders 240, but, there is no limit in the number of the holders that are applicable to the specimen holder according to the present invention. Because at least a part of the body 100 is held on the holder 240, the holder 240 is designed to have a proper height in such a manner that the body 100 can be horizontally held on the holder 240 together with the joining part 220 and the support 230.

Moreover, the holder 240 has a semicircular groove formed in the upper face thereof, and a part of the body 100 is held in the semicircular groove. Therefore, the body 100 can be stably joined to the stand 200 without being easily separated. The semicircular groove formed in the holder 240 has a size corresponding to the size of the body 100. Because the body 100 has the hand-grip part 130 which is thicker than the specimen mounting part 110, the size of the semicircular groove of the holder 240 is changed according to the position where the holder 240 is located on the stand 200. The through hole 22 of the joining part 220, the support 230 and the holder 240 must be designed to have heights to keep horizontality of the body 100 when the body 100 and the stand 200 are joined together.

<Operation of Specimen Holder Used for Observing Top Section of Specimen>

In order to mount the specimen on the specimen holder 10 used for observing the top section of the specimen according to the present invention, the body 100 and the stand 200 must be joined together, and in order to fix the mounted specimen 11, the body 100 must be separated from the stand 200. Hereinafter, referring to FIGS. 13 to 15, an operation of the specimen holder 10 used for observing the top section of the specimen according to the present invention will be described in detail.

Figure 13:
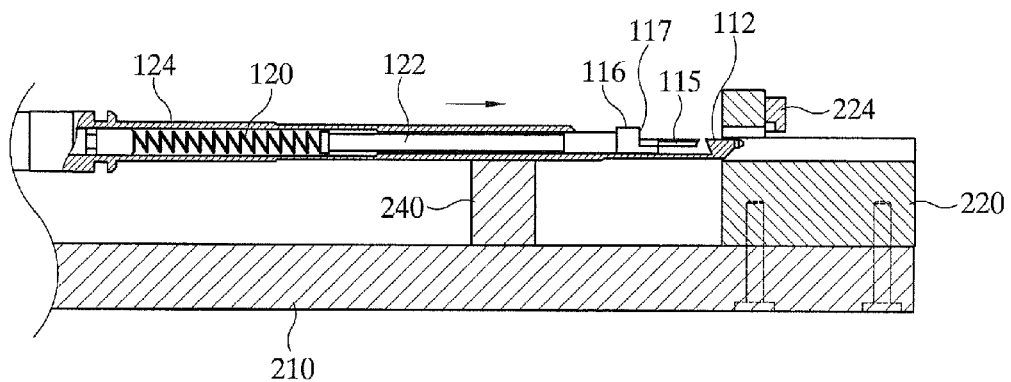
FIG. 13 is a side view showing the state where the body and the stand of the specimen holder according to the present invention are not joined together.

First, FIG. 13 is a side view showing the state where the body and the stand of the specimen holder according to the present invention are not joined together. Referring to FIG. 13, in order to join the body 100 and the stand 200 together, a part of the body 100 is held on the holder 240 of the stand 200. Because the holder 240 has the semicircular groove formed on the upper face thereof, a part of the body 100 which is in the shape of a circular tube can be held in the semicircular groove. When the body 100 is held on the holder 240, the specimen mounting part 110 of the body 100 is located at the position where the through hole 222 of the joining part 220 is formed.

Before the body 100 and the stand 200 are not joined, because the second grip part 114 progresses forward and nearly touches the first grip part 112, the specimen 11 cannot be mounted. So, the second grip part 114 moves backward and the body 100 is pushed forward in order to mount the specimen 11 between the first grip part 112 and the second grip part 114.

Figure 14:
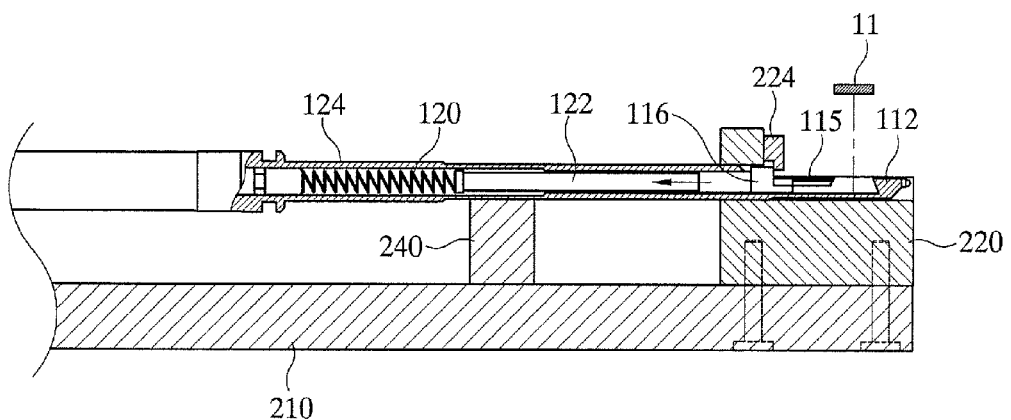
FIG. 14 is a side view showing the state where the body and the stand of the specimen holder according to the present invention are joined together.

Next, FIG. 14 is a side view showing the state where the body and the stand of the specimen holder according to the present invention are joined together. Referring to FIG. 14, when the specimen mounting part 110 of the body 100 is inserted into the through hole 222 of the joining part 220, the body 100 and the stand 200 can be joined together. When a part of the specimen mounting part 110 is inserted into the through hole 222, the stepped portion 117 protrudingly outwardly from the second grip part 114 is in contact with the retaining protrusion 225 of the retaining member 224 which stops a part of the through hole 222. Because the second grip part is connected with the elasticity means 120 through the connecting means 122, when the external force is applied to the second grip part 114, the second grip part 114 can be moved. Therefore, when the specimen mounting part 110 moves forward, the second grip part 114 moves backward while compressing the elasticity means 120.

When the specimen mounting part 110 is sufficiently inserted into the through hole 222, the second grip part 114 moves backward more, and the first space for sufficiently mounting the specimen 11 is formed between the first grip part 112 and the second grip part 114. After the first space is formed, the hand-grip part 130 is held on the support 230 of the stand 200. The inwardly formed fixing grooved 132 is formed in the hand-grip part 130, and the fixing protrusion 233 protruding outwardly is formed on the upper face of the support 230, and the fixing groove 132 and the fixing protrusion 233 have the shapes corresponding with each other. When the fixing groove 132 and the fixing protrusion 233 are joined together, because the hand-grip part 130 and the support 230 are joined firmly, the body 100 and the stand 200 can be firmly joined together. When the body 100 and stand 200 are joined together, the user can mount the specimen 11 in the first space using the tweezers. Because the top section of the specimen 11 mounted in the first space faces upward, the user can observe the top section of the specimen 11 using the scanning electron microscope.

Figure 15:
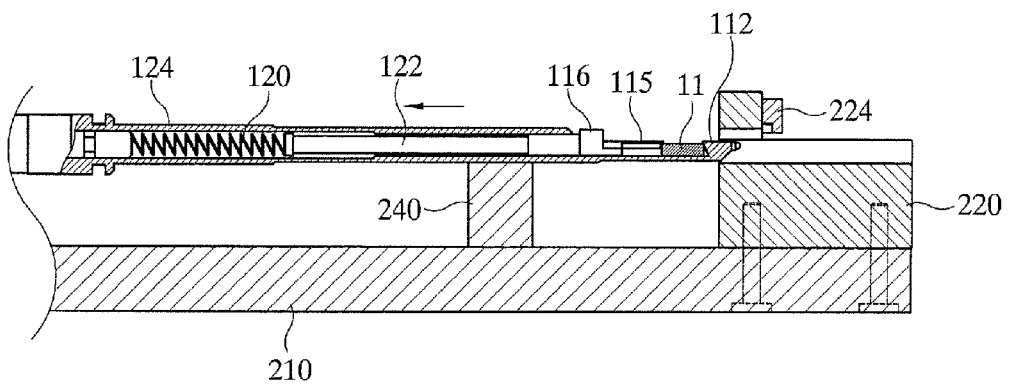
FIG. 15 is a side view showing a state where the body of the specimen holder according to the present invention is separated from the stand and the specimen is fixed.

Next, FIG. 15 is a side view showing a state where the body of the specimen holder according to the present invention is separated from the stand and the specimen is fixed. Referring to FIG. 15, in order to separate the body 100 from the stand 200, the user gasps the hand-grip part 130, and presses the lever 234 protruding outwardly from the support top portion 232. When the user presses the lever 234, the support top portion 232 lowers down while downwardly rotating by the power applied to the lever 234. The lowering support top portion 232 allows the user to easily separate the hand-grip part 130 held on the support 230 from the support 230. When the user separates the hand-grip part 130 from the support 230 by pressing the lever 234, the user grasps the hand-grip part 130 and reversely moves the body 100 slowly so as to separate the body 100 from the stand 200.

In the case that the specimen mounting part 110 is removed from the through hole 222, while the stepped portion 117 of the second grip part 114 and the retaining protrusion 225 of the retaining member 224 are separated from each other, the external force applied to the stepped portion 117 of the second grip part 114 is removed, and the second grip part 114 moves forward by elasticity of the elasticity means 120. Therefore, because one side of the specimen 11 mounted in the first space is fixed by the first grip part 112 and the other side of the specimen 11 mounted in the first space is fixed by the second grip part 114, the user can obtain an accurate magnified image of the top section of the specimen 11 by applying the fixed specimen 11 to the scanning electron microscope.

As described above, the specimen holder used for observing the top section of the specimen and the method for controlling the same according to the present invention can easily and rapidly mount and fix the specimen without using any tape or paste. Therefore, in the case that the specimen holder used for observing the top section of the specimen according to the present invention is applied to the scanning electron microscope in order to observe the specimen, the user can obtain a clear image and observe the specimen accurately and clearly.

In the meantime, the present invention is implementable as a code for a recording media legible by a computer. The recording media legible by the computer includes all kinds of recording devices which store data legible by the computer system. For instance, there are ROMs, RAMs, CD-ROMs, magnetic tapes, floppy discs, optical data storages, and others as the recording media legible by the computer, and the present invention is implementable as a carrier wave form, for instance, internet transmission. In addition, the recording media legible by the computer may store and implement a code which is distributed to a computer system connected through a network and is legible by the computer in a distribution manner. Furthermore, functional programs, codes and code segments for implementing the present invention can be easily deducted by programmers skilled in the art.

While the present invention has been particularly described with reference to attached drawings, it will be understood by those of ordinary skill in the art that the present invention is not limited to the structures and methods of the described embodiments and all or some of the embodiments of the present invention may be selectively combined to make various changes.

What is claimed is:

1. A specimen holder comprising:
a body;
a specimen mounting part formed at an end of the body for fixing a specimen;
an elasticity member located inside the body;
a stand detachably joined with the body; and
a hand-grip part formed at an end of the body,
wherein the stand comprises:
a base part forming a lower part of the stand;
a joining part protrudingly formed on the upper face of the base part and having a through hole to which at least a part of the specimen mounting part is inserted;
a support protrudingly formed on the upper face of the base part; and
a retaining member connected with the joining part and having a retaining protrusion,
wherein the support comprises:
a support prop forming a lower part of the support; and
a support to portion having a lever protruding outward the support to portion being joined with the support prop by a support screw and being rotatable on the support screw within a range of a predetermined angle,
wherein the specimen mounting part comprises:
a first grip part located at an end portion of the specimen mounting part for fixing one side of the specimen; and
a second grip part movably connected with the elasticity member for fixing an other side of the specimen using elasticity of the elasticity member,
wherein the second grip part comprises:
a flat plate for fixing the other side of the specimen; and
a push rod connected with the elasticity member,
wherein in the case that the body is joined to the stand and at least a part of the specimen mounting part is inserted into the through hole, the second grip part moves to compress the elasticity member and a first space is formed between the first grip part and the moved second grip part,
wherein in the case that the body is separated from the stand after the specimen is mounted in the first space, the second grip part is moved by elasticity of the elasticity member and the moved second grip part fixes the other side of the specimen,
wherein the specimen is fixed in the first space in such a manner that a top section of the specimen faces upward, and the user can observe the top section of the fixed specimen using a scanning electron microscope,
wherein the retaining protrusion stops at least a part of the through hole formed in the joining part,
wherein the second grip part has a stepped portion protruding outward,
wherein in the case that the body is joined to the stand and at least a part of the specimen mounting part is inserted into the through hole, the stepped portion formed on the second grip part is caught to the retaining protrusion, such that the second grip part is moved,
wherein one side of the first rip part getting in contact with one side of the specimen is inclined at a first angle, and one side of the flat plate getting in contact with the other side of the specimen is inclined at a second angle,
wherein at least a part of the hand-grip part is held on the upper face of the support, and
wherein when a power to press the lever is applied, the support top portion lowers down while rotating on the support screw by the power applied to the lever, and the body joined to the stand is separated from the stand using the lowered support top portion.

2. The specimen holder according to claim 1, wherein the support comprises a fixing protrusion formed on the upper face thereof and protruding outward.

3. The specimen holder according to claim 2, wherein the hand-grip part further comprises a fixing groove formed inwardly, and when the fixing groove of the hand-grip part is joined to the fixing protrusion of the support, the body is fixed to the stand.

4. The specimen holder according to claim 1, wherein the support further comprises an elastic portion for connecting the support prop and the support top portion, and wherein when the power which presses the lever is removed, the support top portion ascends while rotating on the support screw by elasticity of the elastic portion.

5. The specimen holder according to claim 1, wherein the stand further comprises a holder protrudingly formed on the upper face of the base part, so that at least a part of the body is held on the holder.

6. A method for controlling a specimen holder for observing the top section, of a specimen comprising:

a first step of joining a body to a stand;
a second step of mounting a specimen in a first space; and
a third step of separating the body from the stand,
wherein the first step comprises the steps of:
inserting at least a part of the specimen mounting part into a through hole;
moving a second grip part; and
forming the first space between a first grip part and the moved second grip part,
wherein the specimen mounting part is formed at an end of the body for fixing the specimen and includes the first grip part and the second grip part,
wherein a hand-grip part is formed at an end of the body,
wherein the second grip part includes a flat plate for fixing the other side of the specimen and a push rod connected with the elasticity member,
wherein the first grip part fixes one side of the specimen and the second grip part fixes an other side of the specimen,
wherein the through hole is formed in a joining part located on the upper face of a base part and at least a part of the specimen mounting part is inserted into the through hole,
wherein the base part forms a lower part of the stand, and
wherein the specimen is fixed in the first space in such a manner that a top section of the specimen faces upward, and the user can observe the top section of the fixed specimen using a scanning electron microscope,
wherein the stand includes a retaining member connected with the joining part and having a retaining protrusion,
wherein the retaining protrusion stops at least a part of the through hole formed in the joining part,
wherein the stand includes a support protrudingly formed on the upper face of the base part,
wherein at least a part of the hand-grip part is held on the upper face of the support,
wherein the support includes a support prop forming a lower part of the support and a support top portion having a lever protruding outward, the support top portion being joined with the support prop by a support screw and being rotatable on the support screw within a range of a predetermined angle,
wherein when a power to press the lever is applied, the support top portion lowers down while rotating on the support screw by the power applied to the lever, and the body joined to the stand is separated from the stand using the lowered support top portion,
wherein the second grip part has a stepped portion protruding outward,
wherein in the case that the body is joined to the stand and at least a part of the specimen mounting part is inserted into the through hole, the stepped portion formed on the second grip part is caught to the retaining protrusion, such that the second grip part is moved, and
wherein one side of the first grip part getting in contact with one side of the specimen is inclined at a first angle, and one side of the flat plate getting in contact with the other side of the specimen is inclined at a second angle.

* * * * *